United States Patent [19]

Song et al.

[11] Patent Number: 5,444,301
[45] Date of Patent: Aug. 22, 1995

[54] SEMICONDUCTOR PACKAGE AND METHOD FOR MANUFACTURING THE SAME

[75] Inventors: Chi J. Song, Daejon; Gi B. Cha, Choongchungbook-Do, both of Rep. of Korea

[73] Assignee: Goldstar Electron Co. Ltd., Choongchungbook-Do, Rep. of Korea

[21] Appl. No.: 260,571

[22] Filed: Jun. 16, 1994

[30] Foreign Application Priority Data

Jun. 23, 1993 [KR] Rep. of Korea ............... 11506/1993

[51] Int. Cl.⁶ .................... H01L 23/48; H01L 29/44; H01L 29/52; H01L 29/60
[52] U.S. Cl. ..................... 257/737; 257/783
[58] Field of Search ............... 257/737, 670, 738, 778, 257/671, 693, 676, 668, 666, 752, 753, 673, 783

[56] References Cited

U.S. PATENT DOCUMENTS

| | | | |
|---|---|---|---|
| 4,604,644 | 8/1986 | Beckham et al. | 257/737 |
| 4,974,057 | 11/1990 | Tazima | 257/737 |
| 5,283,446 | 2/1994 | Tanisawa | 257/737 |

FOREIGN PATENT DOCUMENTS

| | | | |
|---|---|---|---|
| 6094744 | 5/1985 | Japan | 257/778 |
| 63-254758 | 10/1988 | Japan . | |

OTHER PUBLICATIONS

IBM Technical Disclosure Bulletin, vol. 33 No. 7 Dec. 1990, "Direct Chip Bonding for LCD", p. 213.
IBM Technical Disclosure Bulletin, vol. 25 No. 4 Sep. 1982; "Photo-Defined Lamination for Chip Bonding", C. Edwards, Paper 1952/53.

*Primary Examiner*—Sara W. Crane
*Assistant Examiner*—Jhihan Clark
*Attorney, Agent, or Firm*—Lowe, Price, LeBlanc & Becker

[57] ABSTRACT

A plastic semiconductor package and a method for producing the same. The package comprises a plurality of chip signal transmitting leads protruded from a semiconductor chip and functioning as electrical passage, a plurality of polyimide tapes each attached to the corresponding lead and having the same width as that of the lead, a plurality of insulating double-sided tapes each attached to a side of an upper surface of the corresponding lead for attaching the lead to the semiconductor chip, a plurality of conductive bumps each disposed to the other side of the upper surface of the corresponding lead for electrically connecting the lead to the semiconductor chip, and mold resin enveloping a predetermined area including the semiconductor chip and the leads. Since the package does not have metal wire, it is possible to reduce deterioration of a package due to wire-bonding, since the method of the invention eliminates a trimming/forming step to simplify its process.

8 Claims, 2 Drawing Sheets

SEMICONDUCTOR PACKAGE AND METHOD FOR MANUFACTURING THE SAME

BACKGROUND OF THE INVENTION

1. Field of the Invention

The present invention relates to a semiconductor package and a method for manufacturing the same, and more particularly to a plastic semiconductor package and a method for manufacturing the same wherein bumps are constructed such that the semiconductor package can be lightened, thinned and miniaturized to be densely surface-mounted on a printed circuit board.

2. Description of the Prior Art

Referring to FIG. 1, there is shown a conventional plastic semiconductor package. As illustrated in the drawing, the plastic semiconductor package comprises a semiconductor chip 1, a lead frame 2 including a lead frame pad 2a on which the semiconductor package chip 1 is attached, a plurality of inner leads 2b wire-bonded to the semiconductor chip 1 and outer leads 2c extended from the outer leads 2c, a plurality of metal wires 3 for electrically connecting the inner leads 2b of the lead frame 2 to the semiconductor chip 1, and mold resin 4 for enveloping a certain area occupied by the wire-bonded semiconductor chip 1 and the inner leads 2b of the lead frame 2 to form a package body.

The semiconductor chip 1 is fixedly attached to the pad 2a of the lead frame 2 by epoxy adhesive 5. The package body is made of the mold resin 4 by using transfer molding.

A method for manufacturing the above-constructed conventional plastic package comprises, a die attaching step of attaching the semiconductor chip 1 separated from a wafer to the pad 2a of the lead frame 2 by using epoxy adhesive 5, a wire-bonding step of electrically connecting the die attached semiconductor chip 1 to the inner leads 2b of the lead frame 2 by means of the metal wires 3, a molding step of forming the package body by molding mold resin to envelope an area occupied by the wire-bonded semiconductor chip and the inner leads 2b, and a trimming/forming step of cutting dam bars connected to outer ends of the lead frame 2 to provide a separate semiconductor package and bending the cut outer leads 2c of the semiconductor package into required shapes.

However, the plastic semiconductor package produced by the above-mentioned method has disadvantages in that since an area occupied by a single package is increased because of presences of the outer leads 2c outward protruded from both sides of the mold resin 4 and metal wires 3 for electrically connecting the semiconductor chip 1 to the inner leads 2b, rate of area occupied by the package on a primed circuit board (not shown) is increased.

Also, since the conventional outer leads 2c of the lead frame 2 frequently undergoes poor bending and poor contact, accuracy of test for electrical property is deteriorated. In addition, the package susceptible to be broken and delaminated between surfaces due to difference of thermal expansion coefficient between the semiconductor chip 1 and the die pad 2a.

Furthermore, the conventional method for manufacturing a semiconductor package has disadvantages in that since gaps are formed between leads due to mechanical stress during the trimming/forming step, moisture is penetrated therebetween, thereby causing the package to deteriorate. Also, since the method must pass through various complicated steps, productivity is decreased and manufacturing cost is increased.

SUMMARY OF THE INVENTION

Therefore, the present invention is made in view of the above-described prior art problems and an object of the invention is to provide a plastic semiconductor package which is lightened, thinned and miniaturized to be densely surface-mounted on a printed circuit board and which is improved in its electrical property.

Another object of the present invention is to provide a method for manufacturing a plastic semiconductor package which is simplified in its process and which can improve productivity and reduce manufacturing cost.

In accordance with the present invention, the first object of the invention can be accomplished by providing a plastic semiconductor package comprising: a plurality of chip signal transmitting leads protruded from the semiconductor chip and functioning as electrical passage; a plurality of polyimide tapes each attached to the corresponding lead and having the same width as that of the lead; a plurality of insulating double-sided tapes each attached to a side of an upper surface of the corresponding lead for attaching the lead to the semiconductor chip; a plurality of conductive bumps each disposed to the other side of the upper surface of the corresponding lead for electrically connecting the lead to the semiconductor chip; and mold resin enveloping a predetermined area including the semiconductor chip and the leads.

Also, the second object of the invention can be accomplished by providing a method for manufacturing a semiconductor package comprising the step of: disposing conductive bumps to one-sides of upper surfaces of chip signal transmitting leads and attaching insulating polyimide tapes to lower surfaces of the leads; attaching the leads to a semiconductor chip by means of double-sided tapes interposed therebetween; electrically connecting the semiconductor chip to the leads by heat-pressing the conductive bumps to the corresponding leads; molding mold resin into an predetermined area surrounding the semiconductor chip to have lower surfaces of the leads exposed at the lower surface of the molded resin body; and detaching the polyimide tapes from the lower surfaces of the leads, carrying out a chemical deflash process for eliminating flashes and soldering the exposed surfaces of the leads.

BRIEF DESCRIPTION OF THE DRAWINGS

These and other objects and aspects of the invention will become apparent from the following description of an embodiment with reference to the accompanying drawings in which.

DETAILED DESCRIPTION OF THE PREFERRED EMBODIMENTS

The present invention will now be described in detail by referring to the accompanying drawings.

Figure 1:
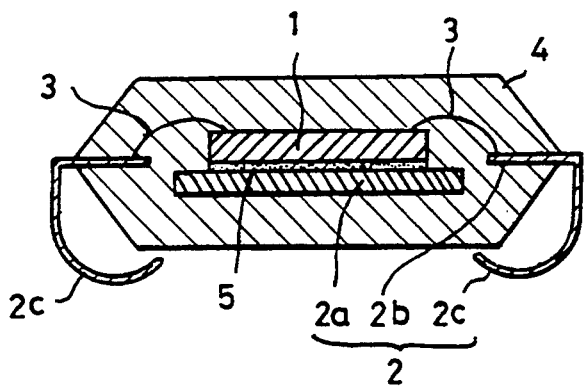
FIG. 1 is a sectional view of a conventional plastic semiconductor package.
Figure 2A:
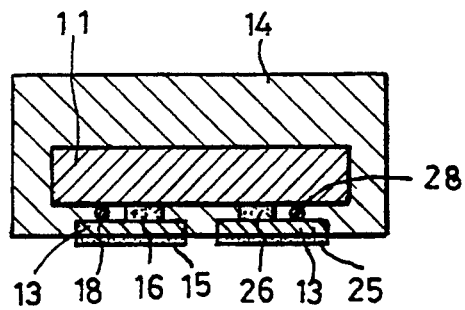
FIGS. 2A and 2B are sectional views showing an embodiment of a plastic semiconductor package according to the present invention.
Figure 2B:
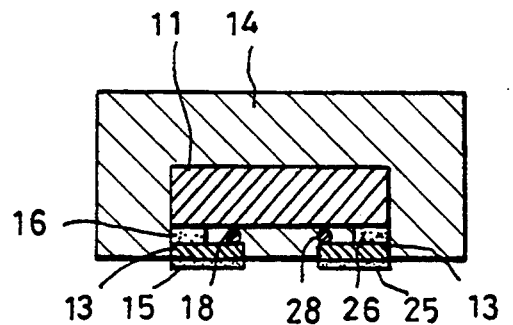
Figure 3:
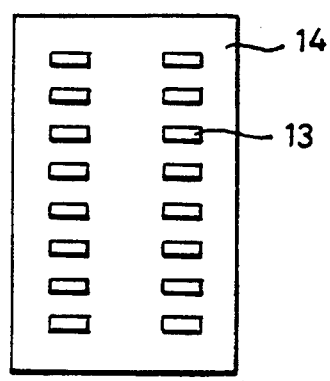
FIG. 3 is a bottom view of the plastic semiconductor package shown in FIGS. 2A and 2B.

FIGS. 2A and 2B are sectional views of embodiments of a plastic semiconductor package according to the present invention and FIG. 3 is a bottom view of a plastic semiconductor package according to the invention.

As illustrated in FIG. 2A, the semiconductor package according to the invention is constructed as follows. A plurality of chip signal transmitting leads 13 on which a semiconductor chip 11 having a predetermined shape is mounted are protruded from a lower surface of a mold resin body, and the semiconductor chip 11 and the chip signal transmitting leads 13 are electrically connected to each other by conductive bumps 18 and 28 interposed therebetween.

Figure 4:
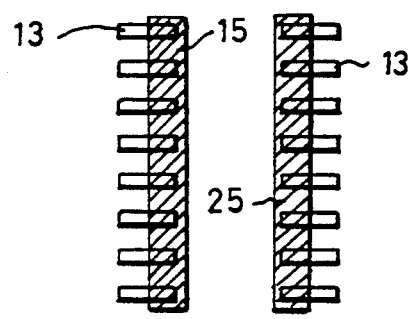
FIG. 4 is a plan view of the plastic semiconductor package shown in FIGS. 2A and 2B.

More specifically stated, the plurality of chip signal transmitting leads 13 are arranged with a certain spacing therebetween and attached to polyimide tapes 15 and 25 having certain sizes, as shown in FIG. 4. As again shown in FIG. 2A, the leads 13 and the semiconductor chip 11 are all attached to each other by means of double-sided adhesive tapes 16 and 26 interposed therebetween, and also electrically connected to each other by means of conductive bumps 18 and 28 interposed therebetween. The above-attached semiconductor 11, the tapes 16 and 26, the conductive bumps 18 and 28 and inner parts of the leads 13 are enveloped by molding the mold resin 14.

The chip signal transmitting leads 13 are sized and positioned such that those are not protruded from outline of the semiconductor chip 11 as seen from plan, and are downset at about 50–100 μm in this embodiment of the invention.

The insulating double-sided adhesive tape 16 and 26 are made of thermosetting or thermoplastic tape and have thickness of 70–150 μm.

The conductive bumps 18 and 28 are made of solder or gold as its major component and has a height of 20–50 μm.

In the plastic semiconductor package according to the invention, the relative position of the double-sided tapes 16 and 26 and the conductive bumps 18 and 28 can adopt either of structures shown in FIGS. 2A and 2B.

On the other hand, a method for manufacturing the above-constructed semiconductor package according to the invention comprises, a step of disposing the conductive bumps 18 and 28 to one-side of the upper surfaces of the chip signal transmitting leads 13 and attaching the insulating polyimide tapes 15 and 25 to the lower surfaces of the leads 13, a step of attaching the leads 13 to the semiconductor chip 11 by means of the double-sided tapes 16 and 26 interposed therebetween, a step of electrically connecting the semiconductor chip 11 to the leads 13 by heat-pressing the conductive bumps 18 and 28 to the corresponding leads 13, a step of molding mold resin 14 into an predetermined area surrounding the semiconductor chip 11 to have lower surfaces of the leads 13 exposed at the lower surface of the molded resin body, and a step of detaching the polyimide tapes 15 and 25 from the lower surfaces of the leads 13, carrying out a chemical deflash process for eliminating flashes and soldering the exposed surfaces of the leads 13.

In this method, as a technique for bonding the conductive bumps 18 and 28 between the semiconductor chip 11 and the leads 13, the well-known Tape Automated Bonding technique is used. Also, as die attaching technique for attaching the semiconductor 11 to the leads 13, an LOC(Lead ON Chip) package technique is used.

The above-mentioned Tape Automated Bonding technique is a technique wherein metal bumps are applied to tapes on which metal pattern (mainly consisting of copper and functioning as a lead frame and wires).

In above-described manufacturing method, a step of curing the insulation double-sided tapes 16 and 26 is carried out prior to the molding step. In this step, the curing step is changed according to type of the double-sided tape. That is, it is preferable that an oven after the attachment of the semiconductor chip 11 if it is a thermosetting tape and the tape is cured at the temperature of 150°–450° C. if it is a thermoplastic tape.

According to the invention, although the molded semiconductor package has the exposed surfaces of the leads 13 flush with a surface of the molded package (i.e., a lower surface of the mold resin 14), the exposed surfaces of the leads 13 become protruded from the lower surface of the mold resin 14 by thickness of the solder by carrying out the soldering step.

The resulting protruded leads 13 of the semiconductor package are aligned with a pattern formed on a printed circuit board (not shown) and then subjected to soldering, thereby producing a required finished semiconductor package.

As apparent from the above description, since the plastic semiconductor package according to the invention can be lightened, thinned and miniaturized to be densely surface-mounted on a board, the package of the invention can be applied to various cards (i.e., SRAM CARD, DRAM CARD, MODULE and the like).

In addition to the structural advantages, the invention can improve electrical property and can reduce or eliminate breakage and delamination of a package.

Furthermore, the method for manufacturing the semiconductor package according to the invention can simplify its manufacturing process and can achieve improvement of productivity and reduction of manufacturing cost.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A plastic semiconductor package free of metal wires for electrically connecting a semiconductor chip to inner leads comprising:

a plurality of chip signal transmitting leads attaching from the semiconductor chip and functioning as electrical passage;

a detachable polyimide tape attached to a lower surface of each lead and having the same width as that of the lead;

an insulating double-sided adhesive tape each attached to an upper surface of each lead attaching the lead to the semiconductor chip;

a bump disposed on said upper surface of each lead electrically connecting the lead to the semiconductor chip; and mold resin enveloping a predetermined area including the semiconductor chip and the leads but not said detachable polyimide tapes.

2. A plastic semiconductor package according to claim 1, wherein said chip signal transmitting leads are sized and positioned such that the leads are not protruded from the outline of the mounted semiconductor chip as seen from plan, and are down-set at 50–100 μm.

3. A plastic semiconductor package according to claim 1, wherein said insulating adhesive tapes are thermosetting tapes or thermoplastic tapes.

4. A plastic semiconductor package according to claim 1, wherein said conductive bumps are made of solder or gold.

5. A plastic semiconductor package according to claim 1, wherein said conductive bumps and said double-sided tapes are changed with in position.

6. A plastic semiconductor package according to claim 3, wherein said insulating adhesive tapes have the thickness of 70–150 μm.

7. A plastic semiconductor package according to claim 4, wherein said conductive bumps have the height of 20–50 μm.

8. A plastic semiconductor package comprising:
a semiconductor chip;
a plurality of chip signal transmitting leads each having a lower surface and an upper surface;
a conductive bump for electrically connecting the semiconductor chip to the upper surface of each chip signal transmitting lead, respectively;
a double-sided adhesive tape attached to the upper surface of each chip signal transmitting lead for attaching the lead to the semiconductor chip wherein the lead is positioned over the semiconductor chip; and
a mold resin for molding the semiconductor chip and the leads wherein the lower surface of the leads are exposed from the resin.

* * * * *